US005165097A

United States Patent [19]

Morishima et al.

[11] Patent Number: 5,165,097

[45] Date of Patent: Nov. 17, 1992

[54] CONTROLLER FOR ACOUSTIC APPARATUS

[75] Inventors: Kiyoshi Morishima, Kawasaki; Kazuhiko Masui, Hachioji; Toyohisa Shibasaki, Sakai, all of Japan

[73] Assignee: Kabushiki Kaisha Kenwood, Tokyo, Japan

[21] Appl. No.: 748,837

[22] Filed: Aug. 23, 1991

[30] Foreign Application Priority Data

Aug. 28, 1990 [JP] Japan ................................ 2-224392
Sep. 25, 1990 [JP] Japan ................................ 2-99051[U]

[51] Int. Cl.[5] ....................... H02B 1/00; H03G 11/00; H04R 29/00; H04R 27/00

[52] U.S. Cl. .................................... 381/123; 381/55; 381/59; 381/85

[58] Field of Search .................... 381/96, 59, 123, 85, 381/55, 28

[56] References Cited

U.S. PATENT DOCUMENTS 4,176,251 11/1979 Olden et al. ........................ 381/59
4,389,639 6/1983 Torii et al. ........................ 381/123
4,481,660 11/1984 de Koning et al. ................ 381/85

FOREIGN PATENT DOCUMENTS 59-90488A 5/1984 Japan .................................. 381/55

*Primary Examiner*—James L. Dwyer
*Assistant Examiner*—Jack Chiang
*Attorney, Agent, or Firm*—Sixbey, Friedman, Leedom & Ferguson

[57] ABSTRACT

A surround system comprise front, center, and near amplifiers which respectively drive front, center and rear speaker units. The system operates in a surround sound environment with low impedance (4Ω) speaker units. When high impedance speaker units are connected, the system automatically cuts the center and rear speaker units and operates in a non-surround sound environment by the front amplifier only. Accordingly, the system does not require an excessive large power supply unit.

2 Claims, 2 Drawing Sheets

CONTROLLER FOR ACOUSTIC APPARATUS

BACKGROUND OF THE INVENTION

1. Field of the Invention

The present invention relates to a controller for an acoustic apparatus having a front amplifier, rear amplifier, and center amplifier, which controller operates while suppressing heat generation within in the apparatus.

2. Description of the Related Background Art

In a conventional surround-amplifier having front, rear, and center amplifiers, the three amplifiers always operate so that a temperature rise within the apparatus becomes large. In order to suppress a temperature rise, it is necessary to use large transformers, large heat sinks, and the like.

SUMMARY OF THE INVENTION

The present invention has been made in consideration of the above problem. It is therefore an object of the present invention to provide a controller for an acoustic apparatus capable of suppressing a temperature rise within the apparatus and allowing a use of small transformers and heat sinks.

According to one aspect of the present invention, there is provided a controller for an acoustic apparatus comprising:

a first amplifier;

a second amplifier;

a relay connected between the second amplifier and a loudspeaker connected to the second amplifier;

an impedance selecting switch for selecting an impedance of a loudspeaker connected to the first amplifier;

a power source for selectively applying one of first and second voltages to the first and second amplifiers, the second voltage being higher than the first voltage;

a power source controller for controlling the power source in such a manner that if the impedance of a loudspeaker connected to the first amplifier is a first impedance, the first voltage is applied to the first and second amplifiers, and if the impedance of a loudspeaker connected to the first amplifier is a second impedance, the second voltage is applied to the first and second amplifiers; and a relay controller for controlling the relay in such a manner that when the impedance selecting switch selects the second impedance, the relay is opened.

According to this aspect, if the front loudspeaker having an impedance of 8 ohms is used, the impedance selecting switch is set to select the 8 ohm side. Then, the power source controller applies a higher voltage of the power source to the front amplifier, rear amplifier, and center amplifier.

At the same time, the relay controller opens the relay of the rear amplifier and the relay of the center amplifier. It is therefore possible to make small the capacity and dimension of transformers and heat sinks.

On the other hand, if the impedance of the front loudspeaker is 4 ohms, the impedance selecting switch is set to select the 4 ohm side. Then, the power source controller controls the power source so that a lower voltage is applied to the front amplifier, rear amplifier, and center amplifier.

In this case, the voltage of the power source applied to the three amplifiers is preset such that an excessive current will not flow into the loudspeakers. It is therefore possible to make small the capacity and dimension of transformers and heat sinks.

According to another aspect of the present invention, there is provided a controller for an acoustic apparatus comprising:

a first amplifier;

a second amplifier;

a first switch for selecting the operation state of the first and second amplifiers;

a second switch for selecting an impedance of a loudspeaker connected to the first amplifier;

a state detecting unit for detecting the state of the second switch;

a power source for selectively applying one of first and second voltages to the first and second amplifiers, the second voltage being higher than the first voltage; and a power source controller for controlling the power source in such a manner that if the impedance of a loudspeaker connected to the first amplifier is a first impedance, the first voltage is applied to the first and second amplifiers, and if the impedance of a loudspeaker connected to the first amplifier is a second impedance, the second voltage is applied to the first and second amplifiers, whereby if the first switch is set to make both the first and second amplifiers operate, and if the state detecting unit detects that the impedance of a loudspeaker connected to the first amplifier is the second impedance, then the power source controller controls the power source to apply the first voltage to the first and second amplifiers, in accordance with the detected result by the state detecting unit.

According to the second aspect of the present invention, if the impedance of the front loudspeaker is 4 ohms, the impedance selecting switch is set to select the 4 ohm side. Then, the power source controller controls the power source so that a lower voltage is applied to the front amplifier, rear amplifier, and center amplifier.

On the other hand, if the front loudspeaker having an impedance of 8 ohms is used, the impedance selecting switch is set to select the 8 ohm side. Then, the power source controller applies a higher voltage of the power source to the front amplifier, rear amplifier, and center amplifier.

In this case, if the surround-switch is set to operate all the front amplifier, rear amplifier, and center amplifier, the power source controller controls the power source to apply the lower voltage to the three amplifiers, while considering the 8 ohm impedance of the loudspeaker detected by the state detecting means.

Accordingly the three loudspeakers operate at the lower voltage so that it is possible to make small the capacity and dimension of transformers and heat sinks.

If the surround-switch is set to operate only the front amplifier, the higher voltage is applied to the front amplifier. In this case, the operation of the rear amplifier and center amplifier is caused to stop, thereby allowing to make small the capacity and dimension of transformers and heat sinks.

DETAILED DESCRIPTION OF THE EMBODIMENT

A first embodiment of a controller for an acoustic apparatus of the present invention will be described with reference to FIG. 1.

Figure 1:
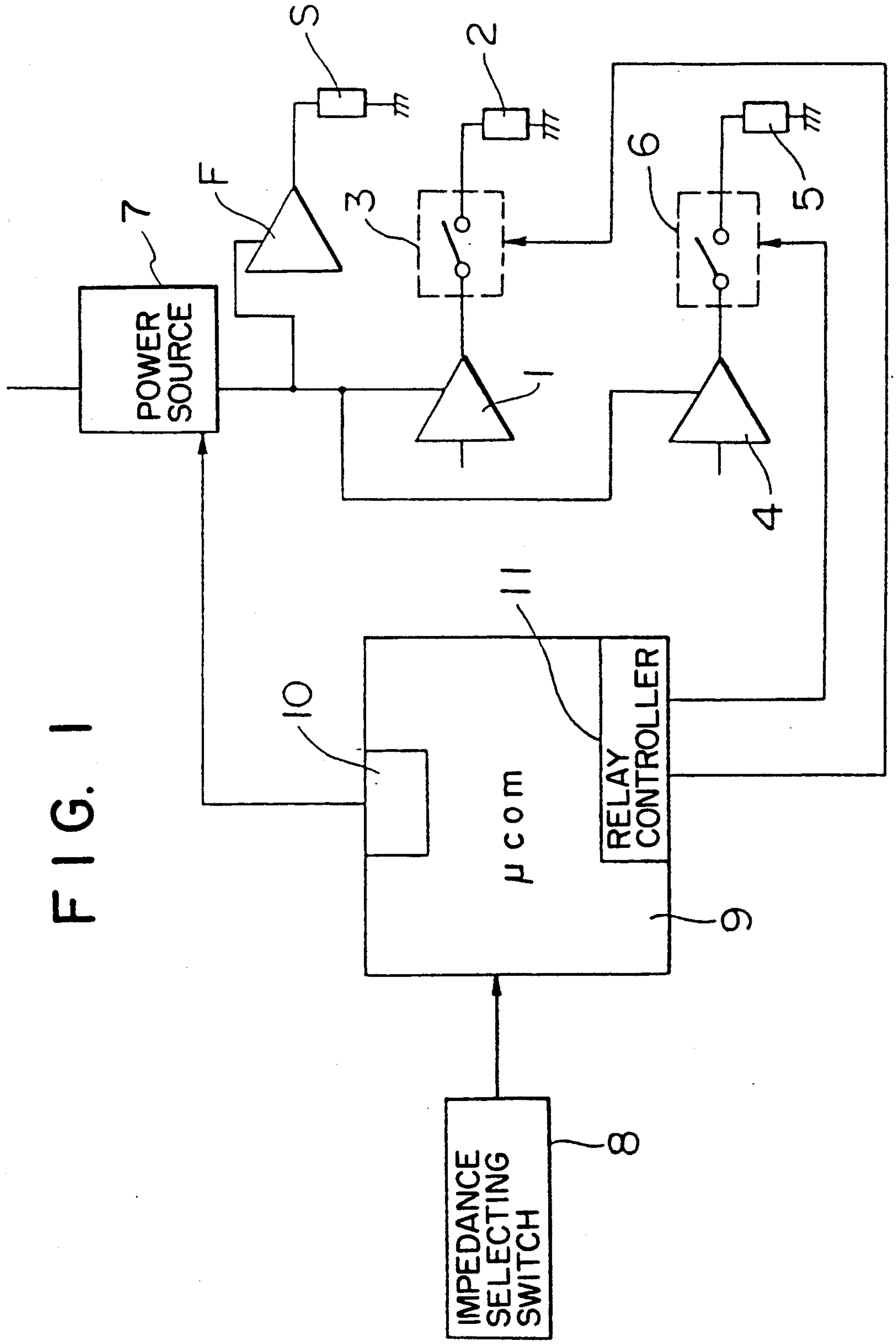
FIG. 1 is a block diagram showing the structure of a controller for an acoustic apparatus according to an embodiment of the present invention.

In FIG. 1, reference numeral 1 represents a rear amplifier, 2 represents a loudspeaker as a load of the rear amplifier, 3 represents a relay connected between the output terminal of the rear amplifier 1 and the loudspeaker 2, 4 represents a center amplifier, 5 represents a loudspeaker as a load of the center amplifier 4, 6 represents a relay connected between the output terminal of the center amplifier 4 and the loudspeaker 5, and 7 represents a power source for selectively applying a first voltage or a second voltage to a front amplifier F, center amplifier 4, and rear amplifier 1. Reference numeral 8 represents an impedance selecting switch which provides an indication of the impedance of a loudspeaker S connected to the front amplifier F. Reference numeral 9 represents a microcomputer which controls the acoustic apparatus in accordance with a selection by the impedance selecting switch 8. Reference numeral 10 represents a power source controller provided in the microcomputer 9 for controlling the power source 7. The power source controller 10 operates in such a manner that if the impedance of the loudspeaker S connected to the front amplifier F is 4 ohms, the first voltage is applied to the front, rear, and center amplifiers, and if the impedance of the loudspeaker S connected to the front amplifier F is 8 ohms, the second voltage higher than the first voltage is applied to the three amplifiers. Reference numeral 11 represents a relay controller provided in the microcomputer 9. The relay controller 11 operates in such a manner that when the impedance selecting switch 8 selects the loudspeaker impedance of 8 ohms, the relays 3 and 6 are opened.

In operation of the controller constructed as above, if the loudspeaker S having an impedance of 8 ohms is used, the impedance selecting switch 8 is set to select the 8 ohm side. Then, the power source controller 10 applies a higher voltage or second voltage of the power source 7 to the front amplifier F, rear amplifier 1, and center amplifier 4.

At the same time, the relay controller 11 opens the relay 3 of the rear amplifier 1 and the relay 6 of the center amplifier 4.

On the other hand, if the impedance of the loudspeaker S is 4 ohms, the impedance selecting switch 8 is set to select the 4 ohm side. Then, the power source controller 10 controls the power source 7 so that a lower voltage or first voltage is applied to the front amplifier F, rear amplifier 1, and center amplifier 4.

A user will use this system in a surround sound environment wherein three amplifiers F, 1 and 4 respectively drive low impedance 4Ω-speakers S, 2 and 5. At this condition, three amplifiers are supplied with a relatively lower voltage power source. Each amplifier is operated in a low power level so that the total power consumption of three amplifiers does not exceed a predetermined amount. When the user wants to use a high impedance 8Ω speaker as speakers S, 2 and 5, the system automatically cuts the connection of speakers 2 and 5 by operating relays 3 and 6. Accordingly, when the 8Ω speakers are connected, all the amplifiers do not operate to drive the 8Ω speakers. Consequently, the system can be designed with a relatively low power consumption.

Figure 2:
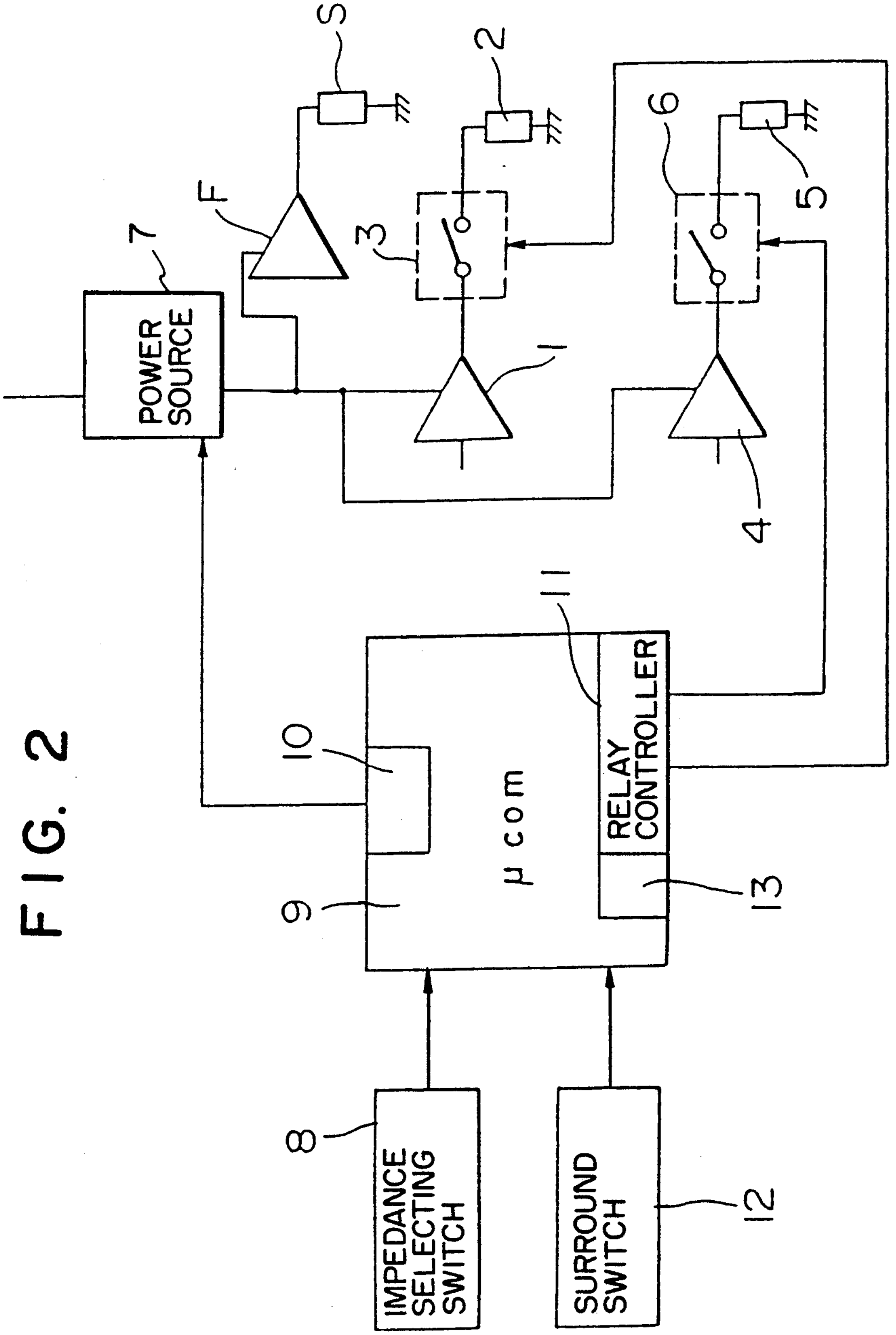
FIG. 2 is a block diagram showing the structure of a controller for an acoustic apparatus according to another embodiment of the present invention.

A second embodiment of a controller for an acoustic apparatus of the present invention will be described with reference to FIG. 2. Like elements to those shown in FIG. 1 are represented by using identical reference numerals, and the description thereof is omitted.

Reference numeral 9 represents a microcomputer which controls the acoustic apparatus in accordance with a selection by the impedance selecting switch 8 and in accordance with the states of the impedance selection switch 8 and a surround-switch 12. Reference numeral 11 represents a relay controller provided in the microcomputer 9, for controlling the relays 3 and 6. Reference numeral 12 represents the surround-switch for selecting the operation state of the front amplifier F, rear amplifier 1, and center amplifier 4. Reference numeral 13 represents a state detecting means provided in the microcomputer 9, for detecting the position, i.e., the state, of the impedance selecting switch 8.

In operation of the controller constructed as above, if the impedance of the loudspeaker S is 4 ohms, the impedance selecting switch 8 is set to select the 4 ohm side. Then, the power source controller 10 controls the power source 7 so that a lower voltage of first voltage is applied to the front amplifier F, rear amplifier 1, and center amplifier 4.

On the other hand, if the loudspeaker S having an impedance of 8 ohms is used, the impedance selecting switch 8 is set to select the 8 ohm side. Then, the power source controller 10 applies a higher voltage or second voltage of the power source 7 to the front amplifier F, rear amplifier 1, and center amplifier 4, but cuts the speakers 2 and 5 off by operating relays 3 and 6.

Accordingly the three low impedance (4Ω) loudspeakers operate at the lower voltage so that it is possible to make small the capacity and dimension of transformers and heat sinks.

If the surround-switch 12 is set to operate only the front amplifier F, the higher voltage is applied to the front amplifier F. In this case, the operation of the rear amplifier 1 and center amplifier 4 is caused to stop, thereby allowing to make small the capacity and dimension of transformers and heat sinks.

As described so far, the acoustic apparatus of the present invention makes it possible to suppress a temperature rise within the apparatus, thereby improving the reliability.

It is also possible to make small the capacity and dimension of transformers and heat sinks, thereby improving the implementation density of components, and making the system cost effective.

Furthermore, the circuit arrangement is simple and the apparatus can be easily realized.

What is claimed:

1. A controller for an acoustic apparatus comprising:

a first amplifier for driving at least one first loudspeaker;

a second amplifier for driving at least one second loudspeaker;

relay switching means connected between said second amplifier and said second loudspeaker for selectively operatively connecting said second amplifier and said second loudspeaker in response to a control signal;

impedance selection means for generating an input indicating said impedance of said first loudspeaker;

a power source connected to said first and second amplifiers for selectively applying one of a first voltage and a second voltage to said first and second amplifiers, said second voltage being higher than said first voltage;

power source controlling means connected to said power source and to said impedance selection means for controlling said power source in response to said impedance selection means, such that if the impedance of said first loudspeaker is a first impedance, said first voltage is applied to said first and second amplifiers, and if the impedance of said first loudspeaker is a second impedance, said second voltage is applied to said first and second amplifiers; and relay controlling means connected to receive said input of said impedance selection means and connected to said relay switching means for providing said control signal to cause the operative disconnection of said second amplifier and said second loudspeaker when said first loudspeaker is of said second impedance.

2. A controller for an acoustic apparatus comprising:

a first amplifier system (F, S) comprising a first amplifier and at least one first loudspeaker having an impedance and operatively connected to said first amplifier;

a second amplifier system (1, 3, 2 or 4, 6, 5) comprising a second amplifier and at least one second loudspeaker having an impedance and operatively connected to said second amplifier;

first switching means (12) for selecting one of first and second operating modes, wherein in the first mode said first amplifier system operates and said second amplifier system does not operate, and in the second mode both of said first and second amplifier systems operate;

second switching means (8) for generating an input indicating said impedance of said first loudspeaker;

a power source (7) connected to said first and second amplifiers for selectively applying one of a first voltage and a second voltage to said first and second amplifiers, said second voltage being higher than said first voltage; and power source controlling means (9, 10) connected to said power source and to said first and second switching means for controlling said power source in response to said first and second switching means, such that:

in said first mode, if the impedance of said first loudspeaker is a first impedance, said first voltage is applied to said first amplifier, and if the impedance of said first loudspeaker is a second impedance, said second voltage is applied to said first amplifier, and such that in said second mode, said first voltage is applied to said first and second amplifiers regardless of the impedance of said first loudspeaker.

* * * * *